United States Patent
Glenn et al.

(10) Patent No.: US 6,638,789 B1
(45) Date of Patent: Oct. 28, 2003

(54) MICROMACHINE STACKED WIREBONDED PACKAGE FABRICATION METHOD

(75) Inventors: Thomas P. Glenn, Gilbert, AZ (US); Steven Webster, Chandler, AZ (US); Roy Dale Hollaway, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 31 days.

(21) Appl. No.: 09/670,500

(22) Filed: Sep. 26, 2000

(51) Int. Cl.[7] .......................... H01L 21/44; H01L 21/50
(52) U.S. Cl. ...................... 438/109; 438/107; 438/110; 438/617
(58) Field of Search .................... 257/692, 685–686, 257/777–778, 690–691, 784, 723, 676; 438/108–112, 118–119, 114, 124–127, 617, 107, 123, 456; 361/386; 430/5

(56) References Cited

U.S. PATENT DOCUMENTS

| | | | |
|---|---|---|---|
| 5,610,431 A | 3/1997 | Martin | 257/415 |
| 5,659,203 A * | 8/1997 | Call et al. | |
| 5,719,069 A | 2/1998 | Sparks | 437/59 |
| 5,844,315 A | 12/1998 | Melton et al. | 257/738 |
| 5,895,229 A | 4/1999 | Carney et al. | 438/106 |
| 5,898,220 A | 4/1999 | Ball | 257/723 |
| 5,915,168 A | 6/1999 | Salatino et al. | 438/110 |
| 5,977,640 A | 11/1999 | Bertin et al. | 257/777 |
| 6,074,891 A | 6/2000 | Staller | 438/53 |
| 6,084,308 A | 7/2000 | Kelkar et al. | 257/777 |
| 6,214,644 B1 | 4/2001 | Glenn | 438/108 |
| 6,229,217 B1 * | 5/2001 | Fukui et al. | |
| 6,232,150 B1 * | 5/2001 | Lin et al. | 438/119 |
| 6,255,736 B1 * | 7/2001 | Kaneko | |
| 6,291,881 B1 * | 9/2001 | Yang | |

* cited by examiner

Primary Examiner—Long Pham
Assistant Examiner—Dilinh Nguyen
(74) Attorney, Agent, or Firm—Gunnison, McKay & Hodgson, L.L.P.; Serge J. Hodgson

(57) ABSTRACT

To form a micromachine package, a bead is applied to the rear surface of a controller chip. The controller chip is positioned above an active area in a front surface of a micromachine chip. The bead is attached to the front surface of the micromachine chip to attach the controller chip to the micromachine chip. Once the controller chip is attached to the micromachine chip, the bead and controller chip form an enclosure around the micromachine area. This enclosure protects the micromachine area from the ambient environment. Bond pads on a front surface of the controller chip are then wirebonded to leads of a leadframe or substrate.

23 Claims, 7 Drawing Sheets

MICROMACHINE STACKED WIREBONDED PACKAGE FABRICATION METHOD

BACKGROUND OF THE INVENTION

1. Field of the Invention

The present invention relates generally to the packaging of electronic components. More particularly, the present invention relates to a method of fabricating a micromachine package.

2. Description of the Related Art

Micromachine sensing elements (hereinafter micromachines) are well known. A micromachine included a miniature moveable structure, such as a bridge, cantilevered beam, suspended mass, membrane or capacitive element, which was supported over a cavity formed in a silicon wafer. Since the operation of the micromachine depended upon the moveability of the miniature moveable structure, it was critical that the package, which included the micromachine, did not contact the miniature moveable structure in any manner.

FIG. 1 is a cross-sectional view of a structure 8 during the formation of a plurality of micromachine packages in accordance with the prior art. As shown in FIG. 1, a silicon wafer 10 included a plurality of micromachine chips 12. Micromachine chips 12 included micromachine areas 14 formed in an upper surface 10U of wafer 10. Micromachine areas 14 included the miniature moveable structure of the micromachine. Micromachine chips 12 further included bond pads 16 on upper surface 10U of wafer 10. Bond pads 16 were connected to the internal circuitry of micromachine chips 12.

Micromachine chips 12 were integrally connected together in an array format. Each of micromachine chips 12 was delineated by a singulation street 20, which was located between adjacent micromachine chips 12.

A silicon lid 30 formed from a silicon wafer was positioned above wafer 10. Lid 30 included a plurality of caps 42 integrally connected to one another. Each cap 42 included a micromachine cavity 32. Each micromachine cavity 32 was positioned over a corresponding micromachine area 14. Generally, micromachine cavities 32 were wider than micromachine areas 14.

Each cap 42 further included a bond pad cavity 34. Each bond pad cavity 34 was positioned over a corresponding set of bond pads 16 on a micromachine chip 12. Generally, bond pad cavities 34 were wider than bond pads 16, and were at least as deep as bond pads 16 were tall.

FIG. 2A is a cross-sectional view of structure 8 of FIG. 1 at a further stage in fabrication in accordance with the prior art. As shown in FIG. 2A, lid 30 was attached to wafer 10. Micromachine cavities 32 were positioned above corresponding micromachine areas 14. Further, bond pad cavities 34 were positioned above corresponding sets of bond pads 16.

FIG. 2B is a cross-sectional view of structure 8 of FIG. 2A at a further stage of fabrication in accordance with the prior art. Referring to FIG. 2B, a series of shallow cuts were made to remove a portion of each cap 42 to expose bond pads 16. Micromachine chips 12 were electrically tested by connecting test probes to bond pads 16. Should testing of a micromachine chip 12 indicate that the micromachine chip 12 was defective, the micromachine chip 12 and/or corresponding cap 42 was marked. For example, micromachine chip 12A was marked as being defective. Wafer 10 was then singulated along singulation streets 20. Micromachine chips 12 which were marked as defective were discarded.

Disadvantageously, a cap 42 was attached to a micromachine chip 12 even if the micromachine chip 12 was defective. The cap 42 and defective micromachine chip 12 were discarded. However, since a cap 42 was attached to the defective micromachine chip 12, the cost associated with the defective micromachine chip 12 was increased compared to the cost associated with the defective micromachine chip 12 alone. This increased the cost of fabricating each batch of micromachine packages. This, in turn, increased the cost of fabricating each individual micromachine package which passed testing.

After singulation of wafer 10, each good micromachine chip 12 with cap 42 was further packaged. FIG. 3 is a cross-sectional view of a single micromachine package 40 in accordance with the prior art. As shown in FIG. 3, micromachine chip 12 and cap 42 were attached to a substrate 60. Bond pads 16 were electrically connected to traces 44 by bond wires 46. To prevent accumulation of static charge on cap 42, which would render micromachine chip 12 inoperable, cap 42 was electrically connected to a ground trace 48 by a bond wire 50. Ground trace 48 was grounded during use. Although effective at prevent accumulation of static charge on cap 42, grounding cap 42 by electrically connecting cap 42 to ground through bond wire 50 and ground trace 48 was relatively labor intensive and complex, which increased the cost of fabricating package 40.

A controller chip 52, which was the controller for micromachine chip 12, was also attached to substrate 60. Bond pads 62 of controller chip 52 were electrically connected to traces 44 by bond wires 46.

By integrating controller chip 52 with micromachine chip 12 into a single package 40, several advantages were realized as compared to attaching controller chip 52 and micromachine chip 12 separately as separate packages to the printed circuit mother board. One advantage was that less labor was required during component attachment to the printed circuit mother board. As a result, the cost of the electronic device employing package 40 was reduced. Another advantage was a reduction in final functional device size. However, when compared to a standard micromachine package containing only a single micromachine chip 12, i.e., without controller chip 52, package 40 was considerably larger, had reduced electrical performance and was significantly more expensive.

SUMMARY OF THE INVENTION

In accordance with the present invention, a micromachine package includes a micromachine chip having an active area, e.g., a micromachine area, in a front surface of the micromachine chip. The package further includes a controller chip having a rear surface and a front surface. An upper bond pad is on the front surface of the controller chip. A bead secures the rear surface of the controller chip to the front surface of the micromachine chip.

By mounting the controller chip directly on the micromachine chip, the size of the package is substantially reduced compared to a conventional package having a micromachine chip and controller chip in a side-by-side arrangement. More particularly, the size of the package in accordance with present invention is only slightly larger than the size of the micromachine chip.

Advantageously, a cavity above the micromachine area is formed by the bead and the controller chip. Accordingly, the cap of the prior art, which protected the micromachine area, is eliminated. Since the cap is eliminated, the prior art requirement of grounding the cap is likewise eliminated. Accordingly, the package is fabricated at a lower cost than a micromachine package of the prior art.

To further reduce the costs associated with the micromachine package, in one embodiment, a plurality of controller chips are attached to a plurality of micromachine chips while the micromachine chips are integrally connected together, e.g., while still in wafer form.

Illustratively, to attach a controller chip, a bead is applied to a rear surface of the controller chip. The controller chip further includes upper bond pads on a front surface of the controller chip. The controller chip is positioned above the micromachine area. The bead is attached to the front surface of the micromachine chip thus mounting the controller chip to the micromachine chip.

Advantageously, the controller chips are attached only to the micromachine chips which have been tested and found to be good. In this manner, waste of the controller chips is avoided and labor associated with attaching the controller chips to defective micromachine chips is saved.

In an alternative embodiment, the bead is applied to the front surface of the micromachine chip around a perimeter of the active area. The bead is contacted with the rear surface of the controller chip thus mounting the controller chip to the micromachine chip.

In either embodiment, the micromachine chip is singulated and incorporated into a lead frame type package or, alternatively, a ball grid array type package.

Also in accordance with the present invention, a micromachine package includes an upper chip mounted as a flip chip to a lower chip. In accordance with this embodiment, a plurality of traces are on the front surface of the lower chip. Upper bond pads of the upper chip are physically connected to the traces thus mounting the upper chip to the lower chip.

In one embodiment, the lower chip includes a micromachine area in the front surface of the lower chip. Alternatively, or in addition, the upper chip includes a micromachine area in the front surface of the upper chip.

A bead in combination with the upper chip and the lower chip form an enclosure, which defines a cavity. Advantageously, the micromachine area(s) in the front surface of the upper chip and/or in the front surface of the lower chip are located in the cavity and are protected from the ambient environment.

To form the package, the upper bond pads are aligned with the traces. The upper bond pads are physically connected to the traces. Illustratively, the upper bond pads are directly connected to the traces or, alternatively, are connected by flip chip bumps to the traces. A bead is formed around a periphery of the upper chip to seal and protect the micromachine area. The micromachine chip is singulated and incorporated into a lead frame type package, or, alternatively, a ball grid array type package.

These and other features and advantages of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
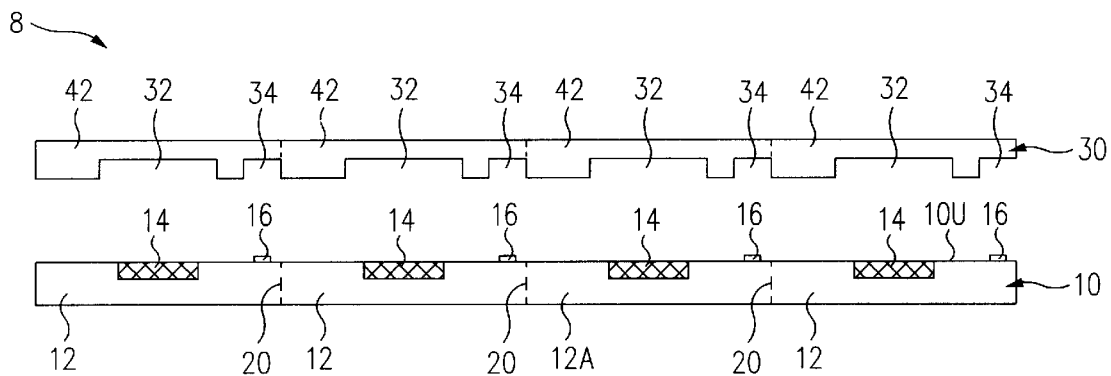
FIG. 1 is a cross-sectional view of a structure during the formation of a plurality of micromachine packages in accordance with the prior art.
Figure 2A:
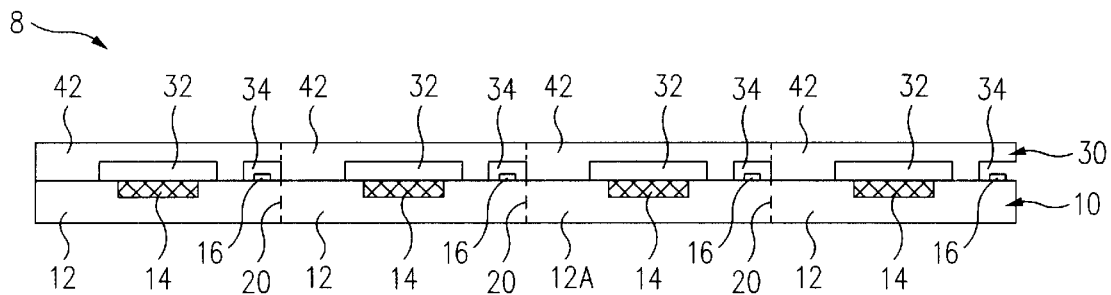
FIG. 2A is a cross-sectional view of the structure of FIG. 1 at a further stage in fabrication in accordance with the prior art.
Figure 2B:
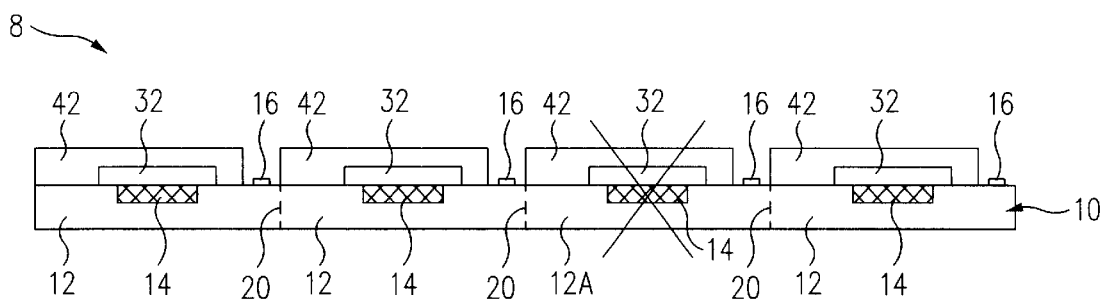
FIG. 2B is a cross-sectional view of the structure of FIG. 2A at a further stage in fabrication in accordance with the prior art.

In accordance with the present invention, a micromachine package 400 (FIGS. 4 and 5) includes a micromachine chip 412 having an active area 414, e.g., a micromachine area, in a front surface 412F of micromachine chip 412. Package 400 further includes a controller chip 452 having a rear surface 452R and a front surface 452F. An upper bond pad 462A is on front surface 452F of controller chip 452. A bead 450 secures rear surface 452R to front surface 412F of micromachine chip 412.

Figure 3:
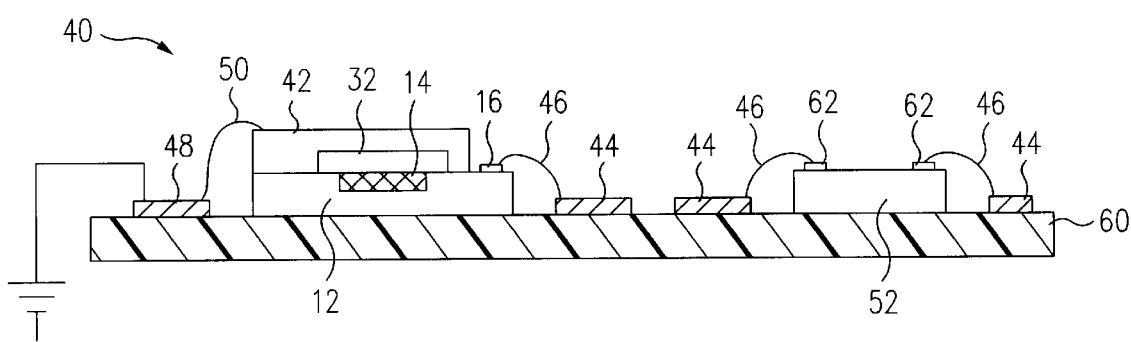
FIG. 3 is a cross-sectional view of a single micromachine package in accordance with the prior art.

By mounting controller chip 452 directly on micromachine chip 412, the size of package 400 is substantially reduced compared to a conventional package having a micromachine chip and controller chip in a side-by-side arrangement (see package 40 of FIG. 3, for example). More particularly, the size of package 400 in accordance with present invention is only slightly larger than the size of micromachine chip 412.

Advantageously, cavity 454 above micromachine area 414 is formed by bead 450 and controller chip 452. Accordingly, the cap of the prior art (see cap 42 of package 40 of FIG. 3, for example), which protected the micromachine area, is eliminated. Since the cap is eliminated, the prior art requirement of grounding the cap is likewise eliminated. Accordingly, package 400 is fabricated at a lower cost than a micromachine package of the prior art.

To further reduce the costs associated with each micromachine package 400, in one embodiment (FIG. 8), a plurality of controller chips 452 are attached to a plurality of micromachine chips 412 while micromachine chips 412 are integrally connected together, e.g., while still in wafer form.

Figure 9:
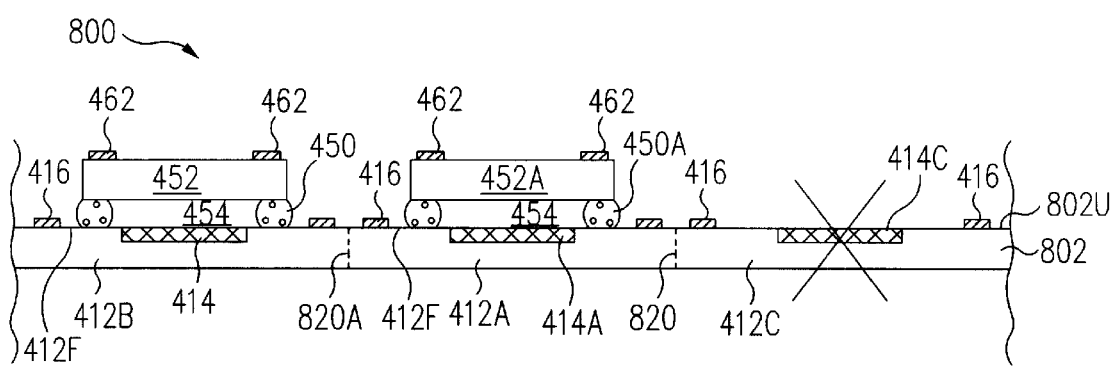
FIG. 9 is a cross-sectional view of the structure of FIG. 8 at a further stage in fabrication.

Illustratively, to attach a controller chip 452A, a bead 450A is applied to a rear surface 452R of controller chip 452A. Controller chip 452A further includes upper bond pads 462 on a front surface 452F of controller chip 452A. Controller chip 452A is positioned above micromachine area 414A. As shown in FIG. 9, bead 450A is attached to front surface 412F of micromachine chip 412A.

Advantageously, controller chips 452 are attached only to micromachine chips 412 which have been tested and found to be good. In this manner, waste of controller chips 452 is avoided and labor associated with attaching controller chips 452 to defective micromachine chips 412 is saved.

In an alternative embodiment, bead 450A is applied to front surface 412F of micromachine chip 412A around a perimeter of active area 414A. Bead 450A is contacted with rear surface 452R of controller chip 452A thus mounting controller chip 452A to micromachine chip 412A.

Figure 12:
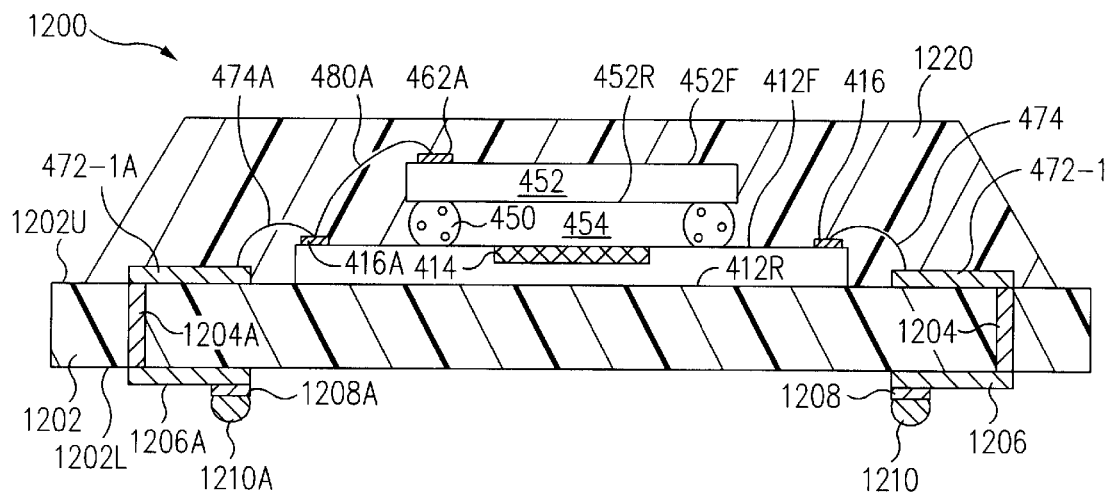
FIG. 12 is a cross-sectional view of a ball grid array micromachine package in accordance with one embodiment of the present invention.

In either embodiment, micromachine chip 412A is singulated and incorporated into a lead frame type package, e.g., package 400 (FIGS. 4 and 5), or, alternatively, a ball grid array type package, e.g., package 1200 (FIG. 12).

Also in accordance with the present invention, a micromachine package 600 (FIGS. 6 and 7) includes an upper chip 452FC mounted as a flip chip to a lower chip 412. In accordance with this embodiment, a plurality of traces 610 are on front surface 412F of lower chip 412. Upper bond pads 462 of upper chip 452FC are physically connected to traces 610 thus mounting upper chip 452FC to lower chip 412.

In one embodiment, lower chip 412 includes a micromachine area 414 in front surface 412F of lower chip 412. Alternatively, or in addition, upper chip 452FC includes a micromachine area 414FC in front surface 452F of upper chip 452FC.

A bead 650 in combination with upper chip 452FC and lower chip 412 form an enclosure, which defines a cavity 454A. Advantageously, micromachine area 414 and/or micromachine area 414FC are located in cavity 454A and are protected from the ambient environment.

Figure 10:
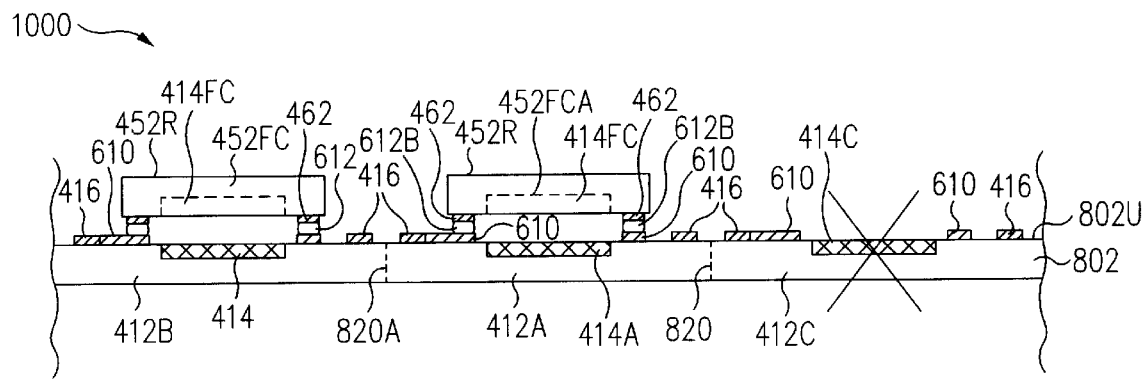
FIG. 10 is a cross-sectional view of a structure during the formation of a plurality of micromachine packages in accordance with an alternative embodiment of the present invention.

Referring now to FIG. 10, to form package 600, upper bond pads 462 are aligned with traces 610. Upper bond pads 462 are physically connected to traces 610. Illustratively, upper bond pads 462 are directly connected to traces 610 or, alternatively, are connected by flip chip bumps 612 to traces 610. Beads 650 (FIG. 11) are formed around peripheries of upper chips 452FC to protect micromachine areas 414 and/or micromachine areas 414FC.

Figure 13:
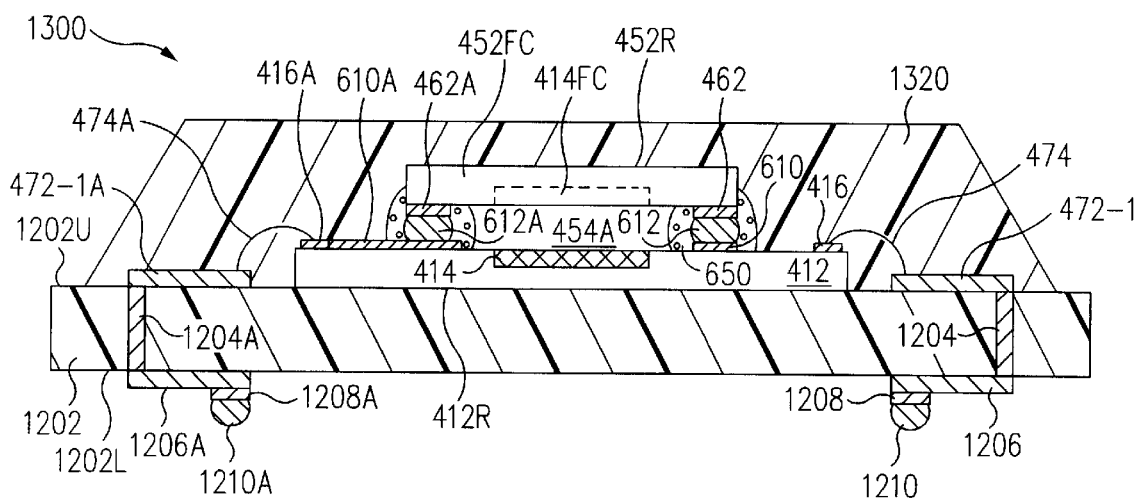
FIG. 13 is a cross-sectional view of a ball grid array micromachine package in accordance with an alternative embodiment of the present invention.

Micromachine chips 412 are singulated and incorporated into lead frame type packages, e.g., packages 600 (FIGS. 6 and 7), or, alternatively, ball grid array type packages, e.g., packages 1300 (FIG. 13).

Figure 4:
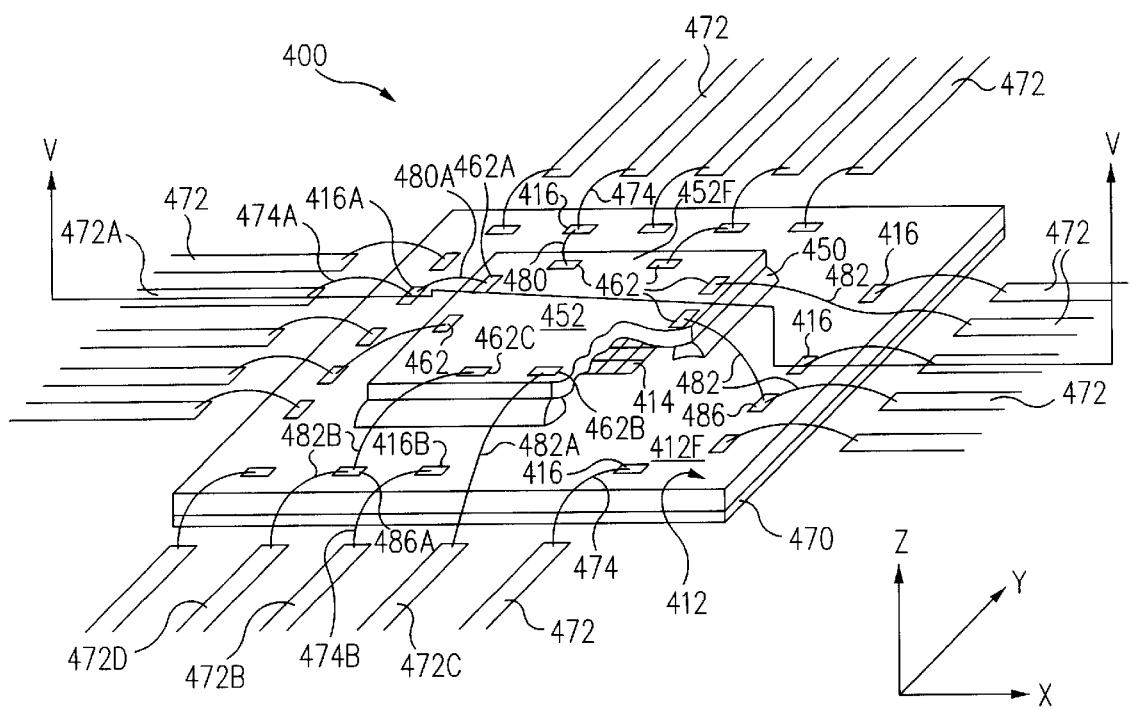
FIG. 4 is a perspective view, partially cutaway, of a micromachine package in accordance with the present invention.
Figure 5:
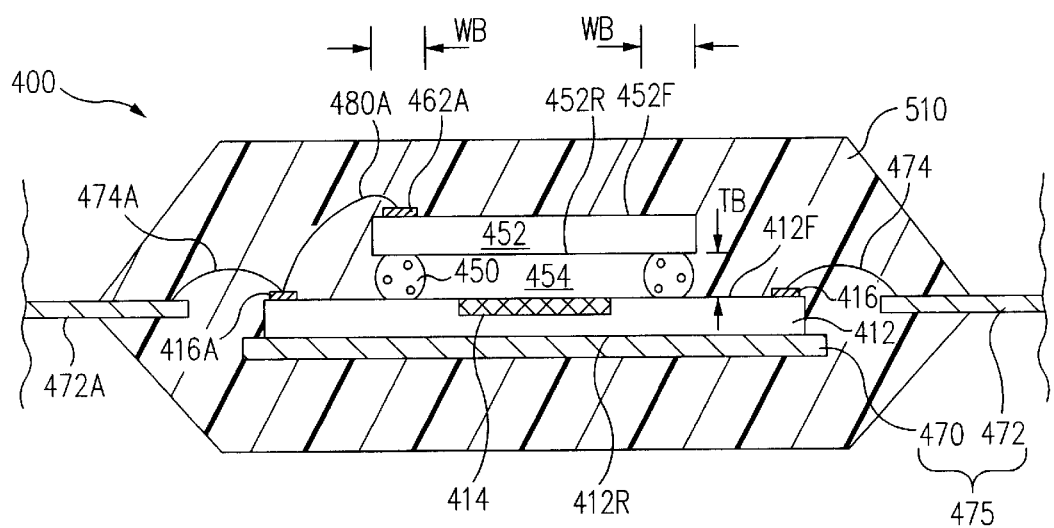
FIG. 5 is a cross-sectional view of the micromachine package along the line V—V of FIG. 4.

More particularly, FIG. 4 is a perspective view, partially cutaway, of a micromachine package 400 in accordance with the present invention. FIG. 5 is a cross-sectional view of micromachine package 400 along the line V—V of FIG. 4. Referring to FIGS. 4 and 5 together, micromachine package 400 includes a micromachine chip 412. Micromachine chip 412 includes a micromachine area 414 in a front, e.g., first, surface 412F of micromachine chip 412. Micromachine area 414 includes a miniature moveable structure, such as a bridge, cantilevered beam, suspended mass, membrane or capacitive element, which is supported over a cavity as is well known to those of skill in the art.

Also formed on front surface 412F of micromachine chip 412 are a plurality of lower bond pads 416. Lower bond pads 416 are connected to the internal circuitry of micromachine chip 412. The number of lower bond pads 416 depends upon the input and output (I/O) requirements of micromachine chip 412.

Attached, i.e., secured, to front surface 412F of micromachine chip 412 is a bead 450. Bead 450 defines an area of front surface 412F, which includes micromachine area 414. More particularly, bead 450 surrounds micromachine area 414 around a perimeter of micromachine area 414 yet does not extend into micromachine area 414. Further, bead 450 does not encompass and leaves exposed lower bond pads 416.

In one embodiment, bead 450 is solder glass, sometimes called lead glass. For example, bead 450 is a lead-based compound such as IWAKI IWAKT-T-187, IWAKI 7583, Kyocera KC-1M, or Kyocera KC-402. In another embodiment, bead 450 is an epoxy, for example, is Hysol 4451.

Bead 450 has a width WB in a direction parallel to front surface 412F (i.e., in the X-Y plane) in the range of approximately 0.002 to 0.005 inches (0.051 to 0.127 millimeters). Bead 450 has a thickness TB in a direction perpendicular to front surface 412F (i.e., along the Z axis) in the range of approximately 0.003 to 0.006 inches (0.076 to 0.152 millimeters) and, in one particular embodiment, of 0.003 inches (0.076 millimeters).

Bead 450 attaches, i.e., secures, a controller chip 452 to front surface 412F. Controller chip 452 is the controller for micromachine chip 412 although other types of chips are used in other embodiments. In particular, bead 450 is attached to the perimeter of a rear, e.g., first, surface 452R of controller chip 452. When attached in this manner, controller chip 452 is mounted to micromachine chip 412 in a wirebond configuration.

Controller chip 452 is substantially parallel to front surface 412F and is spaced apart from front surface 412F by bead 450. Controller chip 452 is located directly above micromachine area 414 and has a greater width along the x-axis and a greater length along the y-axis than micromachine area 414.

By mounting controller chip 452 directly on micromachine chip 412, the size of package 400 is substantially reduced compared to a conventional package having a micromachine chip and controller chip in a side-by-side arrangement (see package 40 of FIG. 3, for example). More particularly, the size of package 400 in accordance with present invention is only slightly larger than the size of micromachine chip 412.

In contrast, the size of a conventional package having a micromachine chip and a controller chip in a side-by-side arrangement was substantially larger than the size of the micromachine chip. The size of the conventional package was larger because the controller chip and traces fanned out around the controller chip occupied a substantial area. Advantageously, this substantial area is eliminated in package 400, resulting in a minimum size for package 400.

Since package 400 in accordance with the present invention is formed to have a minimum size, package 400 is well-suited for use with smaller, lighter weight and less expensive electronic devices.

In this embodiment, controller chip 452 and micromachine chip 412 are formed of silicon. Of importance, the thermal coefficient of expansion of micromachine chip 412 is substantially similar to the thermal coefficient of expansion of controller chip 452. Thus, thermal stress generated between micromachine chip 412 and controller chip 452 is minimized. However, other materials besides silicon are used in other embodiments.

Bead 450 and controller chip 452 form an enclosure which defines a cavity 454, i.e., a free space, above micromachine area 414. Cavity 454 allows the moveable structure of micromachine area 414 to freely move. To insure space 454 is adequate to allow free movement of the moveable structure of micromachine area 414, it is important that controller chip 452 is flat. For example, the maximum allowable deviation from a hypothetical mean plane generally parallel to rear surface 452R of controller chip 452 is 0.004 inches over 2.0 inches of rear surface 452R scaled to the actual size of rear surface 452R.

Although controller chip 452 is described as flat, in light of this disclosure, it is understood that generally controller chip 452 has any shape which prevents controller chip 452 from extending downwards towards micromachine area 414. Further, to hermetically seal micromachine area 414, it is important that both bead 450 and controller chip 452 are impervious to moisture.

Advantageously, cavity 454 above micromachine area 414 is formed by bead 450 and controller chip 452. Accordingly, the cap of the prior art (see cap 42 of package 40 of FIG. 3, for example), which protected the micromachine area, is eliminated. Since the cap is eliminated, the prior art requirement of grounding the cap is likewise eliminated. Accordingly, package 400 is fabricated at a lower cost than a micromachine package of the prior art.

A rear, e.g., second, surface 412R of micromachine chip 412 is attached to a die attach pad 470 of a leadframe 475, e.g., with adhesive. Leadframe 475 further includes a plurality of leads 472. Lower bond pads 416 of micromachine chip 412 are electrically connected to corresponding leads 472 by corresponding bond wires 474. To illustrate, a first lower bond pad 416A of the plurality of lower bond pads 416 of micromachine chip 412 is electrically connected to a first lead 472A of the plurality of leads 472 by a first bond wire 474A of the plurality of bond wires 474. The other lower bond pads 416 are electrically connected to the other corresponding leads 472 by the other corresponding bond wires 474 in a similar fashion.

Formed on a front, e.g., second, surface 452F of controller chip 452 are a plurality of upper bond pads 462. Upper bond pads 462 are connected to the internal circuitry of controller chip 452. The number of upper bond pads 462 depends upon the particular input and output (I/O) requirements of controller chip 452.

Upper bond pads 462 of controller chip 452 are electrically connected to corresponding lower bond pads 416 of micromachine chip 412 by corresponding bond wires 480. To illustrate, a first upper bond pad 462A of the plurality of upper bond pads 462 of controller chip 452 is electrically connected to first lower bond pad 416A of micromachine chip 412 by a first bond wire 480A of the plurality of bond wires 480. The other upper bond pads 462 of controller chip 452 are electrically connected to the other corresponding lower bond pads 416 of micromachine chip 412 by the other corresponding bond wires 480 in a similar fashion.

Referring now to FIG. 4, in this embodiment, the number of upper bond pads 462 of controller chip 452 is less than the number of lower bond pads 416 of micromachine chip 412. In accordance with this embodiment, leads 472 are electrically connected to lower bond pads 416 only, or, alternatively, to corresponding sets of lower bond pads 416 and upper bond pads 462. To illustrate, a second lead 4729 of the plurality of leads 472 is electrically connected by a second bond wire 474B of the plurality of bond wires 474 to a second lower bond pad 416B of the plurality of lower bond pads 416 of micromachine chip 412 only.

Alternatively, as set forth above, lead 472A is electrically connected by bond wire 474A to lower bond pad 416A of micromachine chip 412 and also to upper bond pad 462A of controller chip 452 by bond wire 480A. In this manner, lead 472A is electrically connected to both lower bond pad 416A and upper bond pad 462A, i.e., to a corresponding set of lower bond pads 416 and upper bond pads 462. Accordingly, any voltage or other signal on lead 472A is coupled to lower bond pad 416A and also to upper bond pad 462A.

Although bond wires 474 are set out as being separate from bond wires 480, in light of this disclosure, those of skill in the art will understand that bond wires 474 and bond wires 480 can be single wires. To illustrate, instead of bond wire 480A and bond wire 474A, a single bond wire is electrically connected to upper bond pad 462A, is stitched to lower bond pad 416A, and is electrically connected to lead 472A.

In some applications, it is desirable to electrically connect upper bond pads 462 of controller chip 452 directly to leads 472. For example, when the number of upper bond pads 462 exceeds the number of lower bond pads 416, it may be desirable to electrically connect upper bond pads 462 directly to leads 472. As a further example, when upper bond pads 462 of controller chip 452 require a different voltage or other signal than the corresponding lower bond pads 416 of micromachine chip 412, e.g., an upper bond pad 462 requires ground and the corresponding lower bond pad 416 requires power, then the upper bond pad 462 requiring ground would not be connected to the corresponding lower bond pad 416 requiring power.

Accordingly, leads 472 are also electrically connected directly to upper bond pads 462 of controller chip 452 by bond wires 482. To illustrate, a third lead 472C of the plurality of leads 472 is directly electrically connected by a first bond wire 482A of the plurality of bond wires 482 to a second upper bond pad 462B of the plurality of upper bond pads 462 of controller chip 452 only.

Generally, bond wires 482 are longer than bond wires 474 or bond wires 480. Due to this long length of bond wires 482, bond wires 482 have an increased susceptibility to wire sweep. Wire sweep occurs when bond wires 482 move and short one another and/or break or otherwise fail.

To avoid wire sweep, in one embodiment, bond wires 482 are intermediately bonded to dummy bond pads 486, sometimes called anchors, on front surface 412F of micromachine chip 412. Dummy bond pads 486 are substantially similar, if not the same, as lower bond pads 416 with the exception that dummy bond pads 486 are not connected to the internal circuitry of micromachine chip 412.

To illustrate, a second bond wire 482B of the plurality of bond wires 482 is electrically connected to a fourth lead 472D of the plurality of leads 472 and also to a third upper bond pad 462C of the plurality of upper bond pads 462 of controller chip 452. Bond wire 482B is also electrically connected, i.e., stitched, between lead 472D and upper bond pad 462C to a first dummy bond pad 486A of the plurality of dummy bond pads 486.

In one embodiment, instead of a single bond wire 482B stitched to dummy bond pad 486A, two separate bond wires are used. In accordance with this embodiment, a first bond wire (similar to bond wire 474A) is electrically connected between lead 472D and dummy bond pad 486A of micromachine chip 412. A second bond wire (similar to bond wire 480A) is electrically connected between dummy bond pad 486A and upper bond pad 462C of controller chip 452.

Package 400 further includes a package body 510 (package body 510 is not illustrated in FIG. 4 for purposes of clarity). Package body 510 encloses, electrically isolates, and protects package 400 including micromachine chip 412, bead 450, controller chip 452 and the inner ends of leads 472. Further, package body 510 encloses, electrically isolates, and protects bond wires 474, 480, 482.

In one embodiment, package body 510 is formed at a relatively low cost using a plastic encapsulation process. However, in light of this disclosure, those of skill in the art will recognize that package body 510 can be formed from other materials using other well known processes. To illustrate, in one embodiment, package body 510 is formed from a liquid encapsulant. In accordance with this embodiment, a liquid encapsulant is applied to enclose package 400 and cured.

Figure 6:
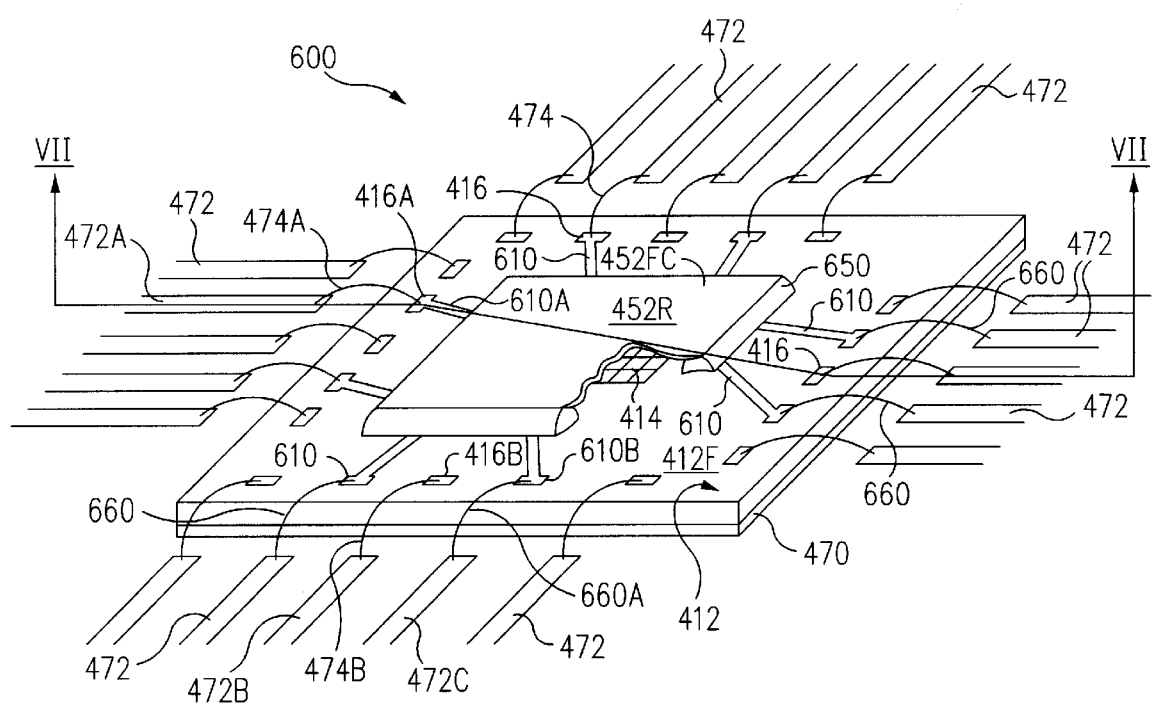
FIG. 6 is a perspective view, partially cutaway, of a micromachine package in accordance with an alternative embodiment of the present invention.
Figure 7:
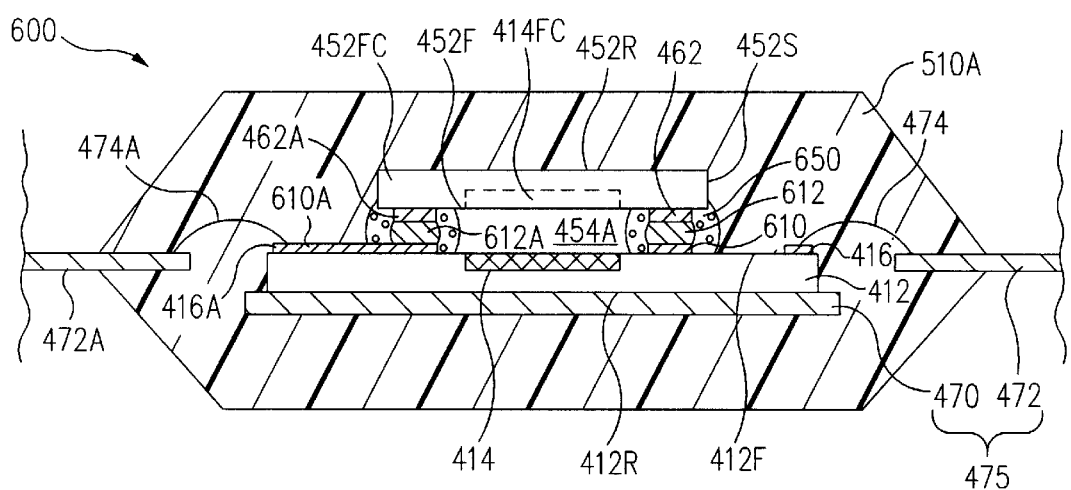
FIG. 7 is a cross-sectional view of the micromachine package along the line VII—VII of FIG. 6.

FIG. 6 is a perspective view, partially cutaway, of a micromachine package 600 in accordance with an alternative embodiment of the present invention. FIG. 7 is a cross-sectional view of package 600 along the line VII—VII of FIG. 6. Package 600 of FIGS. 6 and 7 is similar to package 400 of FIGS. 4 and 5 and only the significant differences between package 600 and package 400 are discussed below.

Referring now to FIGS. 6 and 7 together, a controller chip 452FC is mounted in a flip chip configuration, i.e., as a flip chip, to micromachine chip 412. In accordance with this embodiment, electrically conductive traces 610 are formed on front surface 412F of micromachine chip 412 adjacent micromachine area 414. Traces 610 extend from micromachine area 414 to the periphery of front surface 412F adjacent lower bond pads 416. Illustratively, traces 610 are formed at the same time and during the same processing used to form lower bond pads 416.

Upper bond pads 462 of controller chip 452FC are electrically connected to corresponding traces 610 by corresponding electrically conductive flip chip bumps 612, sometimes called bumps. Illustratively, flip chip bumps 612 are: (1) solder, e.g., a high temperature solder having a melting temperature of approximately 310° C. and/or a 90/10 lead/tin solder; (2) stud bumps, i.e., gold; (3) electrically conductive epoxy paste; or (4) electrically conductive epoxy film, as are well known to those of skill in the art.

To illustrate, a first upper bond pad 462A of the plurality of upper bond pads 462 of controller chip 452FC is electrically connected to first trace 610A of the plurality of traces 610 by a first flip chip bump 612A of the plurality of flip chip bumps 612. The other upper bond pads 462 of controller chip 452FC are electrically connected to the other corresponding traces 610 by the other corresponding flip chip bumps 612 in a similar manner.

Alternatively, upper bond pads 462 of controller chip 452FC are electrically connected directly to corresponding traces 610 and flip chip bumps 612 are not formed. In one embodiment, upper bond pads 462 and traces 610 are gold pads, which are thermo-compression bonded together. As a further alternative, traces 610 are inner bond pads of micromachine chip 412, i.e., are connected to the internal circuitry of micromachine chip 412.

In this embodiment, traces 610 are electrical conductors formed on front surface 412F of micromachine chip 412 and are not connected to the internal circuitry of micromachine chip 412. Traces 610 extend to and are electrically connected to corresponding lower bond pads 416 of micromachine chip 412. To illustrate, trace 610A is electrically connected to a first lower bond pad 416A of the plurality of lower bond pads 416 of micromachine chip 412.

In one embodiment, trace 610A and lower bond pad 416A are separate electrical conductors that contact one another. In another embodiment, trace 610A and lower bond pad 416A are integral, i.e., are a single electrical conductor and not a plurality of separate electrical conductors connected together. The other traces 610 are electrically connected to the other corresponding lower bond pads 416 in a similar manner.

Leads 472 are electrically connected to lower bond pads 416 only, or, alternatively, to corresponding sets of lower bond pads 416 and traces 610. To illustrate, lead 472B is electrically connected by bond wire 474B to lower bond pad 416B of micromachine chip 412 only.

Alternatively, lead 472A is electrically connected by bond wire 474A to lower bond pad 416A of micromachine chip 412 and also to trace 610A and thus to upper bond pad 462A of controller chip 452FC. In this manner, lead 472A is electrically connected to both lower bond pad 416A and upper bond pad 462A, i.e., to a corresponding set of lower bond pads 416 and upper bond pads 462.

Alternatively, leads 472 are electrically connected directly to upper bond pads 462 by bond wires 660, traces 610 and flip chip bumps 612. In accordance with this embodiment, traces 610 are not electrically connected to lower bond pads 416 of micromachine chip 412.

To illustrate, a second trace 610B of the plurality of traces 610 is not electrically connected to any of lower bond pads 416 of micromachine chip 412. Lead 472C is electrically connected by a first bond wire 660A of the plurality of bond wires 660 to trace 610B, which is connected to an upper bond pad 462 by a flip chip bump 612.

An electrically insulative bead 650 encloses flip chip bumps 612. Typically, bead 650 contacts sides 452S of controller chip 452FC and front surface 412F of micromachine chip 412. In this embodiment, bead 650 extends slightly under controller chip 452FC and between controller chip 452FC and micromachine chip 412. Of importance, bead 650 does not extend over or contact micromachine area 414.

In other embodiments, bead 650 extends over controller chip 452FC and contacts the periphery of rear surface 452R or, alternatively, entirely contacts rear surface 452R of controller chip 452FC.

To the extent that controller chip 452FC has a different thermal coefficient of expansion than micromachine chip 412, bead 650 insures that controller chip 452FC does not become dismounted from micromachine chip 412 as a result of differential thermal expansion between controller chip 452FC and micromachine chip 412.

Further, bead 650 forms a seal between the periphery of controller chip 452FC and micromachine chip 412. Thus, controller chip 452FC, bead 650, and micromachine chip 412 define a cavity 454A, which is sealed. In particular, micromachine area 414 is located within cavity 454A, which is sealed to protect micromachine area 414 against external moisture, dust and contamination. In one embodiment, bead 650 is a limited flow epoxy dispense material such as Hysol 4451.

Package 600 further includes a package body 510A (package body 510A is not illustrated in FIG. 6 for purposes of clarity). Package body 510A encloses, electrically isolates, and protects package 600 including micromachine chip 412, bead 650, controller chip 452FC and the inner ends of leads 472. Further, package body 510A encloses, electrically isolates, and protects bond wires 474 and 660.

Referring now to FIG. 7, in an alternative embodiment, a second micromachine chip is used instead of controller chip 452FC. For purposes of the following discussion, micromachine chip 412 is referred to as a lower, e.g., first, chip 412 and controller chip 452FC is referred to as an upper, e.g., second, chip 452FC.

In accordance with this embodiment, upper chip 452FC, i.e., a micromachine chip, includes a micromachine area 414FC (indicated in dashed lines) in front surface 452F. Advantageously, micromachine area 414FC of upper chip 452FC and micromachine area 414 of lower chip 412 are located in cavity 454A and are protected from the ambient environment.

Alternatively, upper chip 452FC is a micromachine chip and lower chip 412 is a controller chip. In accordance with this embodiment, lower chip 412 would be formed without micromachine area 414. Although lower chip 412 and upper chip 452FC having micromachine areas 414, 414FC, respectively, are set forth, those of skill in the art will understand that other chips having active areas other than micromachine areas are similarly packaged in other embodiments.

To further reduce the costs associated with each micromachine package 400 (FIGS. 4 and 5), in one embodiment, a plurality of controller chips 452 are attached to a plurality of micromachine chips 412 while micromachine chips 412 are integrally connected together, e.g., while still in wafer form.

Figure 8:
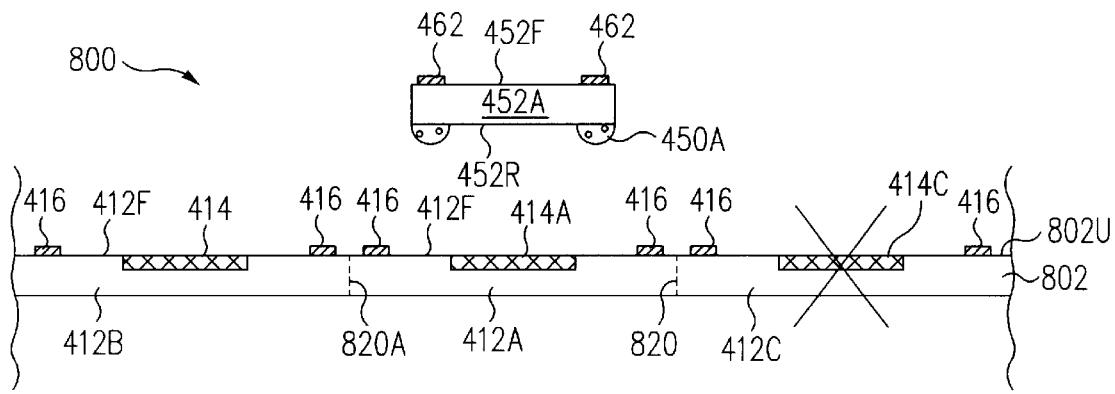
FIG. 8 is a cross-sectional view of a structure during the formation of a plurality of micromachine packages in accordance with one embodiment of the present invention.

FIG. 8 is a cross-sectional view of a structure 800 during the formation of a plurality of micromachine packages 400 in accordance with the present invention. As shown in FIG. 8, a micromachine substrate 802, e.g., a silicon wafer, includes a plurality of micromachine chips 412 integrally connected to one another. Micromachine chips 412 include micromachine areas 414 formed in an upper, e.g., first, surface 802U of micromachine substrate 802. Micromachine areas 414 include the miniature moveable structures of the micromachines. Micromachine chips 412 further include lower bond pads 416 on upper surface 802U of micromachine substrate 802. Lower bond pads 416 are connected to the internal circuitry of micromachine chips 412.

To illustrate, a first micromachine chip 412A of the plurality of micromachine chips 412 includes a first micromachine area 414A of the plurality of micromachine areas 414. The other micromachine chips 412 include micromachine areas 414 in a similar manner.

Micromachine chips 412 are integrally connected together in an array format, e.g., a 2×2, 3×3, ... , or nxm array. Each of micromachine chips 412 is delineated by a singulation street 820, which is located between adjacent micromachine chips 412. For example, a first singulation street 820A of the plurality of singulation streets 820 delineates first micromachine chip 412A from a second micromachine chip 412B of the plurality of micromachine chips 412. The other micromachine chips 412 are similarly delineated from adjacent micromachine chips 412 by corresponding singulation streets 820.

Of importance, micromachine chips 412 are tested for validity, i.e., to determine whether each micromachine chip 412 is good or defective, before controller chips 452 are attached to micromachine substrate 802 and while micromachine chips 412 are integrally attached to one another. Any defective micromachine chips 412 are marked or otherwise identified. For example, micromachine chip 412C is identified as being defective.

As shown in FIG. 8, a bead 450A is attached to a perimeter of a rear surface 452R of a controller chip 452A. Bead 450A is attached to rear surface 452R using any one of a number of methods well known to those of skill in the art such as by screening. For example, a single wafer includes a plurality of controller chips 452 integrally connected together. The material of beads 450 is screened onto a backside surface of the wafer. The wafer is singulated, e.g., by sawing, to form a plurality of controller chips 452 having beads 450 attached, including controller chip 452A having bead 450A attached. As another example, bead 450A is screened directly to controller chip 452A.

After bead 450A is applied to controller chip 452A, controller chip 452A is positioned above first micromachine chip 412A. Micromachine substrate 802 and controller chip 452A are heated. In one embodiment, micromachine substrate 802 is heated to within the approximate range of 100° C. to 300° C. and controller chip 452A is heated to within the approximate range of 400° C. to 420° C. In one particular embodiment, micromachine substrate 802 is heated to 300° C. and controller chip 452A is heated to 420° C. Heating of controller chip 452A causes bead 450A to melt.

A hot cap sealer, which is well known to those of skill in the art, places controller chip 452A over micromachine area 414A such that melted bead 450A contacts upper surface 802U of micromachine substrate 802 around a perimeter of micromachine area 414A. Bead 450A cools, solidifies and attaches to front surface 412F of micromachine chip 412A thus securing controller chip 452A to micromachine chip 412A. Each of the other controller chips 452 are attached to the other good micromachine chips 412 in a manner similar to the attachment of controller chip 452A to micromachine chip 412A. Micromachine substrate 802 is continuously heated while the other controller chips 452 are attached to the other good micromachine chips 412.

In another embodiment, bead 450A is epoxy, e.g., is Hysol 4451. In accordance with this embodiment, bead 450A is attached to rear surface 452R using any one of a number of methods well known to those of skill in the art such as by screening or writing. For example, epoxy is screened directly on controller chip 452A to form bead 450A. Alternatively, epoxy is written directly on controller chip 452A to form bead 450A. To illustrate, a needle dispenser, which is well known to those of skill in the art, writes (i.e. dispenses) epoxy directly on controller chip 452A to form bead 450A. Suitable needle dispensers are available from Camalot, Inc. of Boston, Mass. and MRSI Inc. of Chelmsford, Mass., e.g., a MRSI 375 dispenser.

After bead 450A is applied to controller chip 452A, controller chip 452A is positioned above first micromachine chip 412A. A pick and place machine, which is well known to those of skill in the art, places controller chip 452A over micromachine area 414A such that bead 450A contacts upper surface 802U of micromachine substrate 802 around a perimeter of micromachine area 414A.

Alternatively, bead 450A is applied directly on upper surface 802U of micromachine substrate 802 around a perimeter of micromachine area 414A, e.g., by screening or writing epoxy on upper surface 802U of micromachine substrate 802. After bead 450A is applied, a pick and place machine places controller chip 452A over micromachine area 414A such that rear surface 452R of controller chip 452A contacts bead 450A.

The other controller chips 452 are similarly attached to the other good micromachine chips 412 in a manner similar to the attachment of controller chip 452A to micromachine chip 412A. After all controller chips 452 are placed on upper surface 802U of micromachine substrate 802, beads 450 are cured, e.g., by heating. In one embodiment, structure 800 is heated to 80° C. for 30 minutes and then heated to 150° C. for one hour to two hours.

FIG. 9 is a cross-sectional view of structure 800 at a further stage in fabrication. As shown in FIG. 9, controller chips 452 are attached to micromachine chips 412 which have passed validity testing, i.e., which are good. Advantageously, controller chips 452 are attached only to micromachine chips 412 which have been tested and found to be good. Controller chips 452 are not attached to defective micromachine chips 412. For example, a controller chip 452 is not attached to defective micromachine chip 412C and micromachine area 414C of micromachine chip 412C is left uncovered. In this manner, waste of controller chips 452 is avoided and labor associated with attaching controller chips 452 to defective micromachine chips 412 is saved. This, in turn, minimizes the cost associated with the fabrication of each batch of micromachine packages 400 and, more particularly, with each micromachine package 400.

After controller chips 452 are attached to micromachine substrate 802, structure 800 is heated to anneal and release any built-up stress in structure 800 including controller chips 452, beads 450 and micromachine substrate 802. In one embodiment, structure 800 is heated to within the approximate range of 425° C. to 435° C. for approximately 2 to 4 minutes.

Micromachine substrate 802 is then singulated along singulation streets 820. Referring now to FIGS. 4 and 5 together, for each singulated micromachine chip 412, rear surface 412R is mounted to die attach pad 470 of lead frame 475. Bond wires 474, 480, and 482 are formed, e.g., with a wire bonder. Package body 510 is formed resulting in micromachine package 400. Although the fabrication of a plurality of micromachine packages 400 simultaneously is described above, in light of this disclosure, those of skill in the art will understand that similar techniques are used to fabricate each micromachine package 400 on an individual basis, if desired.

Alternatively, a plurality of packages 600 (FIGS. 6 and 7) are fabricated simultaneously. FIG. 10 is a cross-sectional view of a structure 1000 during the formation of a plurality of micromachine packages 600 in accordance with an alternative embodiment of the present invention. Structure 1000 of FIG. 10 is similar to structure 800 of FIG. 8 and only the significant differences between structure 1000 and structure 800 are discussed below.

Referring now to FIG. 10, controller chips 452FC are attached to micromachine substrate 802. For example, a first controller chip 452FCA of the plurality of controller chips 452FC is attached to first micromachine chip 412A by a first set of flip chip bumps 612B of the plurality of flip chip bumps 612. The other controller chips 452FC are attached to the other corresponding micromachine chips 412 in a similar manner. Generally, controller chips 452FC are attached to corresponding micromachine chips 412 of micromachine substrate 802 by flip chip bumps 612.

To attach controller chips 452FC, each controller chip 452FC is aligned with micromachine substrate 802 using any one of a number of alignment techniques, e.g., controller chips 452FC are optically or mechanically aligned. Controller chips 452FC are attached to micromachine substrate 802 using any one of a number of techniques. For example, flip chip bumps 612, e.g., solder, are formed on upper bond pads 462 of controller chips 452FC or, alternatively, on traces 610. In accordance with this embodiment, flip chip bumps 612 are reflowed, i.e., melted and solidified, to attach upper bond pads 462 to traces 610. In one embodiment, flip chip bumps 612 are reflowed in a nitrogen atmosphere with no solder flux to avoid generation of solder flux residue.

Alternatively, upper bond pads 462 of controller chips 452FC are attached to traces 610 by flip chip bumps 612 formed of an electrically conductive epoxy paste or film, which is thermally or optically cured. As a further alternative, upper bond pads 462 of controller chips 452FC are attached to traces 610 by thermal or thermosonic bonding of flip chip bumps 612 formed of gold formed on upper bond pads 462, or alternatively, on traces 610. Alternatively, upper bond pads 462 of controller chips 452FC are directly attached, e.g. using thermo-compression bonding, to traces 610 and flip chip bumps 612 are not formed.

Generally, upper bond pads 462 of controller chips 452FC are physically connected to traces 610. In light of this disclosure, those of skill in the art will understand that other methods of attaching controller chips 452FC to micromachine substrate 802 can be used.

Figure 11:
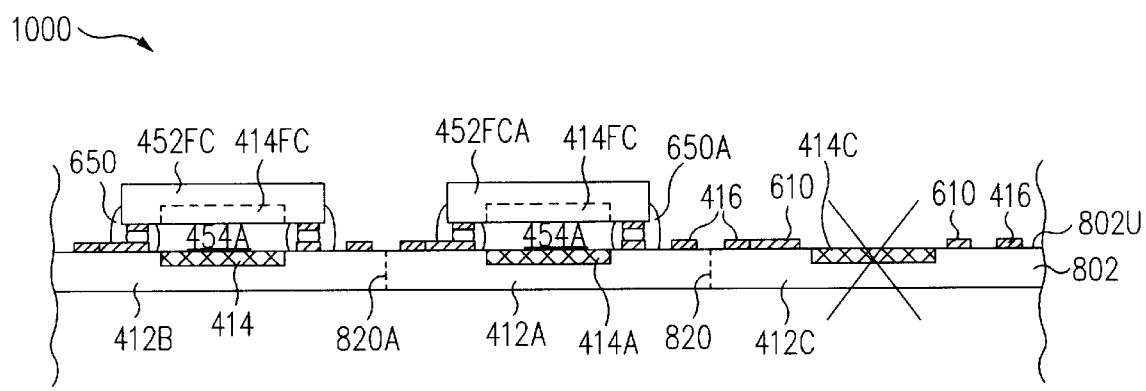
FIG. 11 is a cross-sectional view of the structure of FIG. 10 at a further stage in fabrication.

FIG. 11 is a cross-sectional view of structure 1000 of FIG. 10 at a further stage in fabrication. As shown in FIG. 11, beads 650 are formed around the peripheries of controller chips 452FC. To illustrate, a first bead 650A of the plurality of beads 650 is formed around a periphery of first controller chip 452FCA. The other beads 650 are similarly formed around the peripheries of the other controller chips 452FC in a similar manner.

Of importance, beads 650 do not completely fill the spaces between controller chips 452FC and micromachine substrate 802. More particularly, beads 650 do not contact micromachine areas 414 of micromachine chips 412.

Generally, beads 650 are formed from a limited flow material, e.g., liquid encapsulant. More particularly, a limited flow material is dispensed around controller chips 452FC and drawn slightly between controller chips 452FC and micromachine chips 412 by capillary force. The limited flow material is cured to form beads 650.

To illustrate, a limited flow material is dispense around controller chip 452FCA and drawn slightly between controller chip 452FCA and micromachine chip 412A. The limited flow material is then cured to form bead 650A. For example, an epoxy dispense material, e.g., liquid encapsulant, such as Hysol 4451 is applied using a needle dispenser and then cured to form beads 650.

Micromachine substrate 802 is then singulated along singulation streets 820. Referring now to FIGS. 6 and 7 together, for each singulated micromachine chip 412, rear surface 412R is mounted to die attach pad 470 of lead frame 475. Bond wires 474, 660 are formed, e.g., with a wire bonder. Package body 510A is formed resulting in micromachine package 600. Although the fabrication of a plurality of micromachine packages 600 simultaneously is described above, in light of this disclosure, those of skill in the art will understand that similar techniques are used to fabricate each micromachine package 600 on an individual basis, if desired.

Package 400 of FIGS. 4 and 5 and package 600 of FIGS. 6 and 7 are examples of leadframe type packages in accordance with the present invention. However, in light of this disclosure, those of skill in the art will understand that other types of packages can be fabricated. For example, as discussed in greater detail below with reference to FIGS. 12 and 13, a ball grid array (BGA) type package is fabricated.

FIG. 12 is a cross-sectional view of a ball grid array micromachine package 1200 in accordance with one embodiment of the present invention. Package 1200 of FIG. 12 is similar to package 400 of FIGS. 4 and 5 and only the significant differences between package 1200 and package 400 are discussed below.

Referring now to FIG. 12, controller chip 452 is mounted by bead 450 to micromachine chip 412 in a wirebond configuration as described above. Package 1200 includes a substrate 1202 such as a printed circuit board, ceramic, or tape. Attached to an upper, e.g., first, surface 1202U of substrate 1202 is rear surface 412R of micromachine chip 412. For example, micromachine chip 412 is attached to substrate 1202 with adhesive.

Formed on upper surface 1202U of substrate 1202 are leads 472-1, sometimes called traces. Leads 472-1 are electrically connected to lower bond pads 416, upper bond pads 462 and to corresponding sets of lower bond pads 416 and upper bond pads 462 using bond wires 474, 480, 482 in a manner similar to that described above in reference to leads 472 and bond wires 474, 480, 482 of FIGS. 4 and 5.

Leads 472-1 are electrically connected to a plurality of electrically conductive vias 1204, which extend from upper surface 1202U to a lower, e.g., second, surface 1202L of substrate 1202. Vias 1204 are electrically connected to a plurality of electrically conductive traces 1206 formed on lower surface 1202L of substrate 1202. Formed on traces 1206 are a plurality of electrically conductive pads 1208. A plurality of electrically conductive interconnection balls 1210 such as solder balls are formed on pads 1208. Interconnection balls 1210 are used to electrically connect package 1200 to a larger substrate (not shown) such as a printed circuit mother board.

To illustrate, a first trace 472-1A of the plurality of traces 472-1 on upper surface 1202U is electrically connected to a first via 1204A of the plurality of vias 1204. Via 1204A is electrically connected to a first trace 1206A of the plurality of traces 1206 on lower surface 1202L. Formed on trace 1206A is a first pad 1208A of the plurality of pads 1208. Formed on pad 1208A is a first interconnection ball 1210A of the plurality of interconnection balls 1210.

As set forth above, an electrically conductive pathway between lead 472-1A and interconnection ball 1210A is formed by via 1204A, trace 1206A, pad 1208A. The other leads 472-1, vias 1204, traces 1206, pads 1208 and interconnection balls 1210 are electrically connected to one another in a similar fashion.

Although a particular electrically conductive pathway between interconnection ball 1210A and lead 472-1A is described above, in light of this disclosure, those of skill in the art will understand that other electrically conductive pathways can be formed. For example, substrate 1202 is a multi-layered laminated substrate and, instead of a straight-through vias 1204, a plurality of electrically conductive traces on various layers in substrate 1202 are interconnected by a plurality of electrically conductive vias to form the electrical interconnections between leads 472-1 and traces 1206. In one embodiment, interconnection balls 1210 are distributed in an array format to form a ball grid array (BGA) type package. Alternatively, interconnection balls 1210 are not formed, e.g., to form a metal land grid array (LGA) type package or, alternatively, a leadless chip carrier (LCC) package.

Package 1200 further includes a package body 1220. Package body 1220 encloses, electrically isolates, and protects micromachine chip 412, bead 450 and controller chip 452. Further, package body 1220 encloses, electrically isolates, and protects the plurality of bond wires including bond wires 474, 480, 482, traces 472-1, and upper surface 1202U of substrate 1202.

In one embodiment, package 1200 is fabricated individually. However, in alternative embodiment, a plurality of packages 1200 are formed simultaneously in an array format.

FIG. 13 is a cross-sectional view of a ball grid array micromachine package 1300 in accordance with an alternative embodiment of the present invention. Package 1300 of FIG. 13 is similar to package 600 of FIGS. 6 and 7 and is also similar to package 1200 of FIG. 12 and only the significant differences between package 1300 and packages 600, 1200 are discussed below.

Referring to FIG. 13, controller chip 452FC is mounted in a flip chip configuration to micromachine chip 412 and bead 650 is formed as described above. Rear surface 412R of micromachine chip 412 is mounted to upper surface 1202U of substrate 1202.

Leads 472-1 on upper surface 1202U of substrate 1202 are electrically connected to lower bond pads 416, traces 610 and to corresponding sets of lower bond pads 416 and traces 610 by bond wires 474, 660 in a manner similar to that described above in reference to leads 472 and bond wires 474, 660 of FIGS. 6 and 7.

Package 1300 further includes a package body 1320. Package body 1320 encloses, electrically isolates, and protects micromachine chip 412, bead 650 and controller chip 452FC. Further, package body 1320 encloses, electrically isolates, and protects bond wires 474, 660, traces 472-1, traces 610 and upper surface 1202U of substrate 1202.

In alternative embodiments, packages 400, 600, 1200 and/or 1300 include one or more solder masks. Illustratively, front surface 412F of micromachine chip 412, front surface 452F of controller chip 452, upper surface 1202U of substrate 1202 and/or lower surface 1202L of substrate 1202 include a solder mask.

This application is related to Glenn et al., commonly assigned and co-filed U.S. patent application Ser. No. 09/670,499, entitled "MICROMACHINE STACKED WIREBONDED PACKAGE"; Glenn et al., commonly assigned and co-filed U.S. patent application Ser. No. 09/670,498, entitled "MICROMACHINE STACKED FLIP CHIP PACKAGE"; Glenn et al., commonly assigned and co-filed U.S. patent application Ser. No. 09/670,501, entitled "MICROMACHINE STACKED FLIP CHIP PACKAGE FABRICATION METHOD", which are all herein incorporated by reference in their entirety.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

We claim:

1. A method comprising:
    applying a bead to a first surface of a first chip around a perimeter of an active area in said first surface; and
    contacting said bead with a first surface of a second chip, wherein said bead, said first chip and said second chip form an enclosure, said active area being in a cavity defined by said enclosure, said second chip further comprising a second surface having a first bond pad.

2. The method of claim 1 wherein said active area is a micromachine area.

3. The method of claim 2 wherein said first chip is a micromachine chip.

4. The method of claim 3 wherein said second chip is a controller chip.

5. The method of claim 1 further comprising electrically connecting said first bond pad to a first lead.

6. The method of claim 5 further comprising electrically connecting said first lead to a second bond pad on said first surface of said first chip.

7. The method of claim 1 further comprising electrically connecting a second bond pad on said first surface of said first chip to a first lead.

8. The method of claim 1 wherein said second chip is secured to said first chip by said bead.

9. The method of claim 1 wherein said bead comprises solder glass.

10. The method of claim 1 wherein said bead comprises epoxy.

11. The method of claim 1 further comprising:
forming a bond wire between said first bond pad and a first lead.

12. The method of claim 11, wherein said forming a bond wire between said first bond pad and a first lead further comprises:
stitching said bond wire to a second bond pad on said first surface of said first chip.

13. A method of protecting an active area in a first surface of a first chip comprising:
applying a bead to a first surface of a second chip, said second chip comprising a first bond pad on a second surface of said second chip;
positioning said second chip above said active area; and
attaching said bead to said first surface of said first chip, wherein said bead, said first chip and said second chip form an enclosure, said active area being in a cavity defined by said enclosure.

14. The method of claim 13 wherein said active area is a micromachine area.

15. The method of claim 14 wherein said first chip is a micromachine chip.

16. The method of claim 15 wherein said second chip is a controller chip.

17. The method of claim 13 further comprising electrically connecting said first bond pad to a first lead.

18. The method of claim 17 further comprising electrically connecting said first lead to a second bond pad on said first surface of said first chip.

19. The method of claim 13 further comprising electrically connecting a,second bond pad on said first surface of said first chip to a first lead.

20. The method of claim 13 wherein said second chip is secured to said first chip by said bead.

21. The method of claim 13 wherein said bead comprises solder glass.

22. The method of claim 13 wherein said bead comprises epoxy.

23. A method comprising:
applying a bead to a first surface of a micromachine chip around a perimeter of an active area in said first surface;
contacting said bead with a first surface of a controller chip, said controller chip further comprising a second surface having a first bond pad;
wherein said bead, said micromachine chip and said controller chip form an enclosure, said active area being in a cavity defined by said enclosure;
forming a single wire between said first bond pad and a first lead; and
stitching said single wire to a second bond pad on said first surface of said micromachine chip.

* * * * *